(12) United States Patent
Upadhyayula et al.

(10) Patent No.: US 8,008,132 B2
(45) Date of Patent: Aug. 30, 2011

(54) ETCHED SURFACE MOUNT ISLANDS IN A LEADFRAME PACKAGE

(75) Inventors: Suresh Upadhyayula, San Jose, CA (US); Bonnie Ming-Yan Chan, Sunnyvale, CA (US); Shih-Ping Fan-chiang, Taichung (TW); Hem Takiar, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 202 days.

(21) Appl. No.: 11/966,303

(22) Filed: Dec. 28, 2007

(65) Prior Publication Data

US 2009/0166828 A1  Jul. 2, 2009

(51) Int. Cl.
*H01L 21/00* (2006.01)

(52) U.S. Cl. ........ 438/123; 438/113; 438/124; 438/108; 438/111; 257/667; 257/E21.506; 257/E23.052; 257/E23.106

(58) Field of Classification Search ........... 438/123, 438/106, 118, 111, 113, 108, 124; 257/796, 257/531, 790, 676, 668, 670, 878, 692
See application file for complete search history.

(56) References Cited

U.S. PATENT DOCUMENTS

| | | | |
|---|---|---|---|
| 6,583,499 B2 | 6/2003 | Huang et al. | |
| 6,818,973 B1 * | 11/2004 | Foster | 257/676 |
| 6,867,071 B1 * | 3/2005 | Lee et al. | 438/123 |
| 6,927,480 B2 | 8/2005 | Lee et al. | |
| 2007/0126092 A1 * | 6/2007 | San Antonio et al. | 257/674 |
| 2008/0290486 A1 * | 11/2008 | Chen et al. | 257/676 |
| 2010/0255640 A1 * | 10/2010 | Yu et al. | 438/123 |

FOREIGN PATENT DOCUMENTS

| | | |
|---|---|---|
| JP | 2004228160 | 8/2004 |
| JP | 2005109007 | 4/2005 |

* cited by examiner

*Primary Examiner* — Matthew Smith
*Assistant Examiner* — Wilner Jean Baptiste
(74) *Attorney, Agent, or Firm* — Vierra Magen Marcus & DeNiro LLP

(57) ABSTRACT

A method of fabricating a leadframe-based semiconductor package, and a semiconductor package formed thereby, are disclosed. The semiconductor package includes a leadframe and one or more semiconductor die affixed to a die paddle of the leadframe. The leadframe is formed with a plurality of electrical terminals that get surface mounted to a host PCB. The leadframe further includes one or more extended leads, at least one of which includes an electrically conductive island which gets surface mounted to the host PCB with the electrical terminals. The islands effectively increase the number terminals within the package without adding footprint to the package.

28 Claims, 4 Drawing Sheets

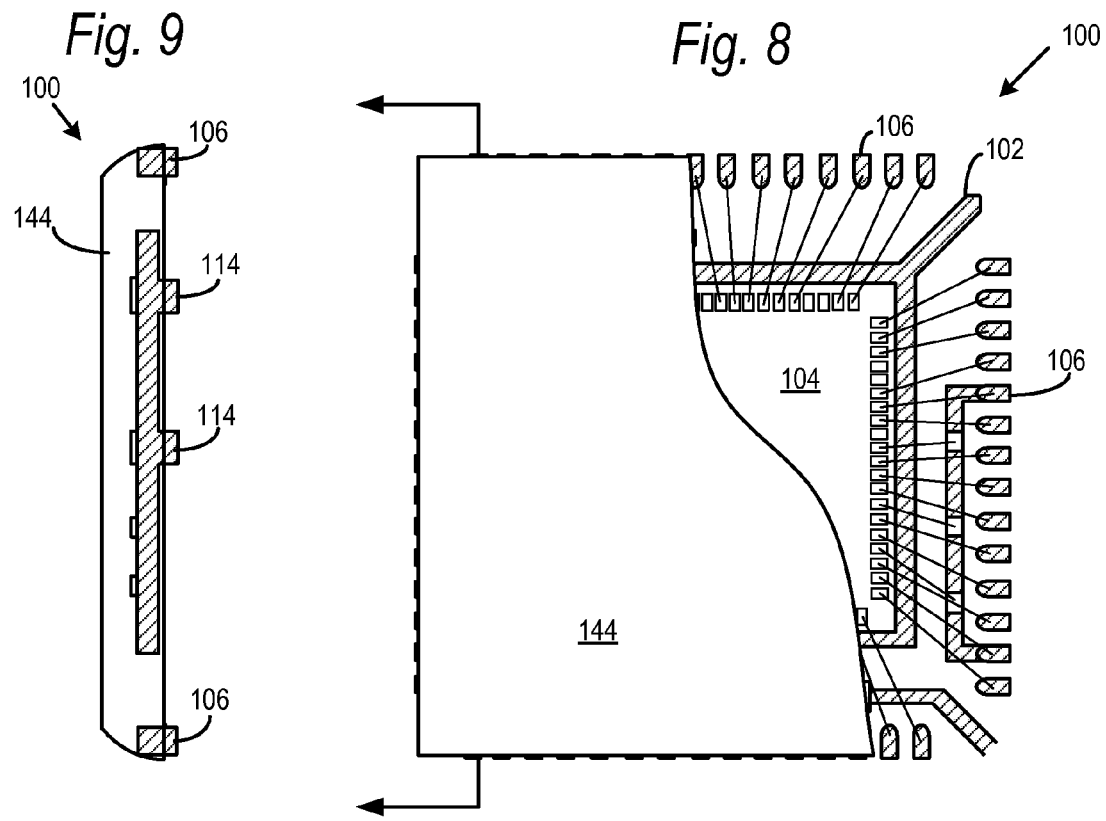
Fig. 9
Fig. 8
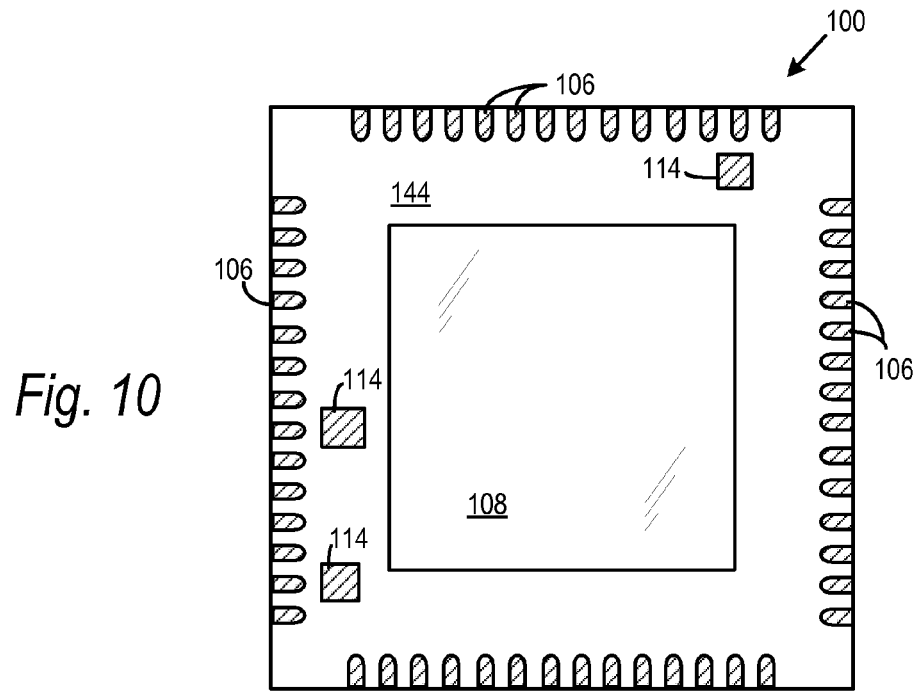
Fig. 10

ETCHED SURFACE MOUNT ISLANDS IN A LEADFRAME PACKAGE

BACKGROUND OF THE INVENTION

1. Field of the Invention

Embodiments of the present invention relate to a method of fabricating a semiconductor package, and a semiconductor package formed thereby.

2. Description of the Related Art

As the size of electronic devices continue to decrease, the associated semiconductor packages that operate them are being designed with smaller form factors, lower power requirements and higher functionality. Currently, sub-micron features in semiconductor fabrication are placing higher demands on package technology including higher lead counts, reduced lead pitch, minimum footprint area and significant overall volume reduction.

One branch of semiconductor packaging involves the use of a leadframe, which is a thin layer of metal on which one or more semiconductor die are mounted. The leadframe includes electrical leads for communicating electrical signals from the one or more semiconductors to a printed circuit board or other external electrical devices. Common leadframe-based packages include plastic small outlined packages (PSOP), thin small outlined packages (TSOP), shrink small outline packages (SSOP) and thin quad flat packages (TQFP). These packages include leads which extend out from the sides of the encapsulated package, which leads may be surface mounted to a host device such as a printed circuit board (PCB) as by soldering. Another common type of leadframe-based package is a leadless package. These include dual flat no-lead (DFN) and quad flat no-lead (QFN) packages. These packages do not have leads extending out of the sides of the package, but instead have exposed terminals at a bottom surface of the package for soldering to a host device such as a PCB.

FIG. 1 shows a leadframe 20 of a QFN package 22 during fabrication. While a single leadframe 20 is shown, the leadframe package 22 would typically be fabricated on a strip of leadframes to achieve economies of scale. A typical QFN leadframe 20 may include fourteen contact terminals 24 per side, though there may be more or less terminals in alternative configurations. As seen in prior art FIG. 2, the terminals 24 are exposed at the bottom surface of the leadframe. The leadframe 20 may further include a die attach pad 26 for structurally supporting one or more semiconductor die 30 on leadframe 20. While die attach pad 26 may provide a path to ground, it conventionally does not carry signals to or from the semiconductor die 30. In certain leadframe configurations, it is known to omit die attach pad 26 and instead attach the semiconductor die directly to the leadframe leads in a so-called chip on lead (COL) configuration.

In embodiments including a die paddle, the die paddle may be affixed to the leadframe strip (not shown) via tie bars 28 extending from all four corners of the die paddle 26. The tie bars 28 support the die paddle on the leadframe strip prior to singulation, and also serve as a path to ground.

The one or more semiconductor die 30 may include one or more flash memory die and/or a controller die. The semiconductor die 30 may include die bond pads 32 on a top surface. Once the semiconductor die 30 is mounted to the leadframe 20, a wire bond process is performed whereby bond pads 32 are electrically coupled to respective electrical terminals 24 using a delicate wire 36 (one of which being labeled in FIG. 1). The assignment of a bond pad 32 to a particular electrical terminal 24 is defined by industry standard specification.

After the one or more die 30 are mounted and electrically coupled to the leadframe, the die 30 and a portion of the leadframe 20 may be encapsulated in a mold compound 40 as seen in the side view of prior art FIG. 3 to complete the leadframe package 20 fabrication. Thereafter, the terminals 24 exposed at the bottom surface of the leadframe package 22 may be soldered to a printed circuit board in a surface mount process to electrically couple the package 22 to the printed circuit board.

Where die 30 is for example a controller die, it is known to provide bond pads 32 around multiple edges on the top surface owing to the large number of electrical connections required between the die 30 and leadframe 20. Die 30 may include many more bond pads 32 than are shown in the Figures, and it is difficult to find room on the leadframe to bond out each of the required electrical connections to terminals 24.

Moreover, certain terminals 24 that are spaced apart from each other need to be electrically connected to each other. Conventionally, this is done by circuitry on the printed circuit board to which the leadframe package 22 is affixed.

SUMMARY OF THE INVENTION

The present invention, roughly described, relates to a method of fabricating a leadframe-based semiconductor package, and a semiconductor package formed thereby. In embodiments, the semiconductor package is a QFN package including a leadframe and one or more semiconductor die affixed to a die paddle of the leadframe. The leadframe is formed with a plurality of electrical terminals that get surface mounted to a host PCB. The leadframe further includes one or more extended leads, at least one of which includes an electrically conductive island which gets surface mounted to the host PCB with the electrical terminals.

The one or more extended leads may originate from opposed corners of the leadframe, in a space normally occupied by tie bars for supporting the die paddle. These tie bars may be omitted in the present invention. A second end of each extended lead may be affixed to one of the terminals for support. Alternatively, a second end of an extended lead may be free floating within the leadframe. Still other extended leads may originate from one of the terminals, and may have a second end which is affixed to a second terminal for support, or which is free floating.

An extended lead may be electrically coupled to the host PCB two ways. First, a lead may include at least one end coupled to a terminal, which is in turn surface mounted to the host PCB. Alternatively or additionally, an extended lead may have an island formed along its length, which island gets surface mounted to the host PCB.

Portions of the back surface of the leadframe may be half-etched to reduce the thickness of certain portions of the leadframe. In particular, the extended leads may be half-etched, but the islands may be full thickness. After wirebonding to the terminals and extended leads, the semiconductor die, wire bonds and a portion of the leadframe may be encapsulated. In particular, the top portion of the leadframe is encapsulated so that portions of the leadframe that were half-etched are completely buried within the mold compound. Thus, the extended leads are not visible from the bottom side of the encapsulated package. However, the mold compound does not encapsulate those portions of the bottom of the leadframe that were not half-etched. Accordingly, in addition to the terminals, the islands formed on the extended leads are visible and exposed on the bottom of the encapsulated package.

The result is that the islands are available in addition to the terminals for surface mounting to the host PCB. Thus, the present invention increases the available terminals for communicating signals between the semiconductor die and host device without increasing the footprint of the package.

BRIEF DESCRIPTION OF THE DRAWINGS

FIG. 8 is a top view of an encapsulated QFN package according to embodiments of the present invention with the encapsulation being partially cut away.

FIG. 9 is a side view of an encapsulated QFN package according to embodiments of the present invention.

FIG. 10 is a bottom view of an encapsulated QFN package according to embodiments of the present invention.

DETAILED DESCRIPTION

Embodiments of the present invention will now be described in reference to FIGS. 4-10, which in general relate to a method of fabricating a semiconductor package, and a semiconductor package formed thereby. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
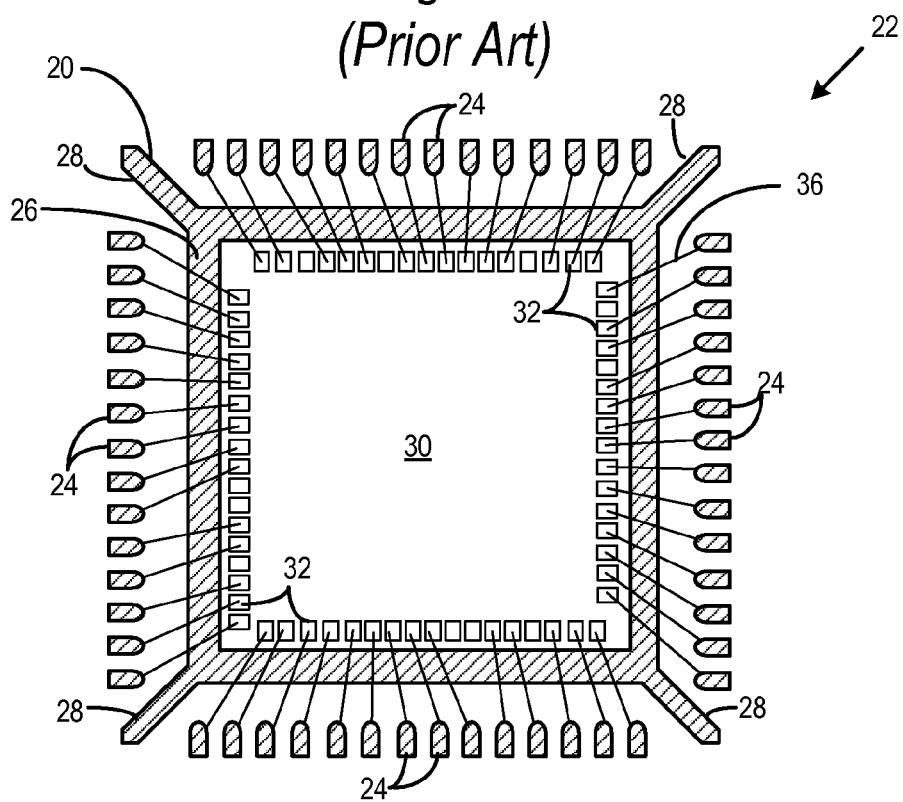
FIG. 1 is a top view of a conventional QFN leadframe and a semiconductor die.
Figure 2:
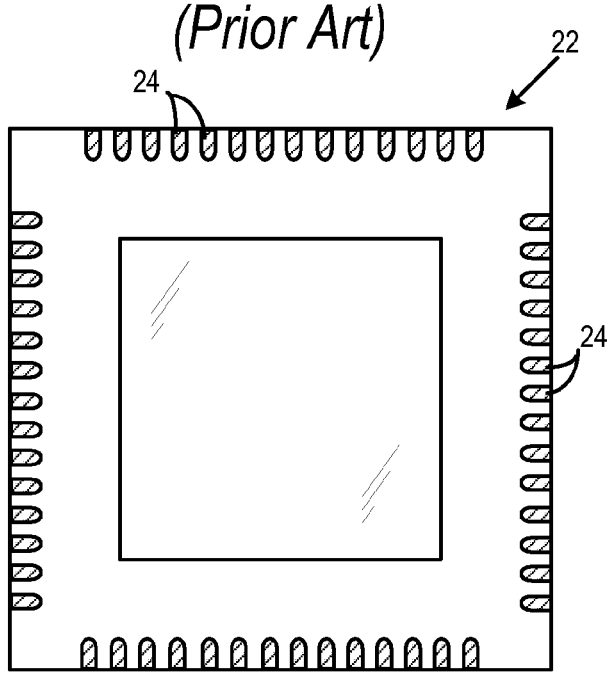
FIG. 2 is a bottom view of a conventional encapsulated QFN leadframe package.
Figure 3:
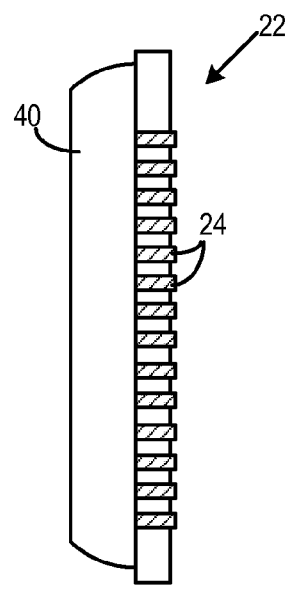
FIG. 3 is a side view of a conventional encapsulated QFN leadframe package.
Figure 4:
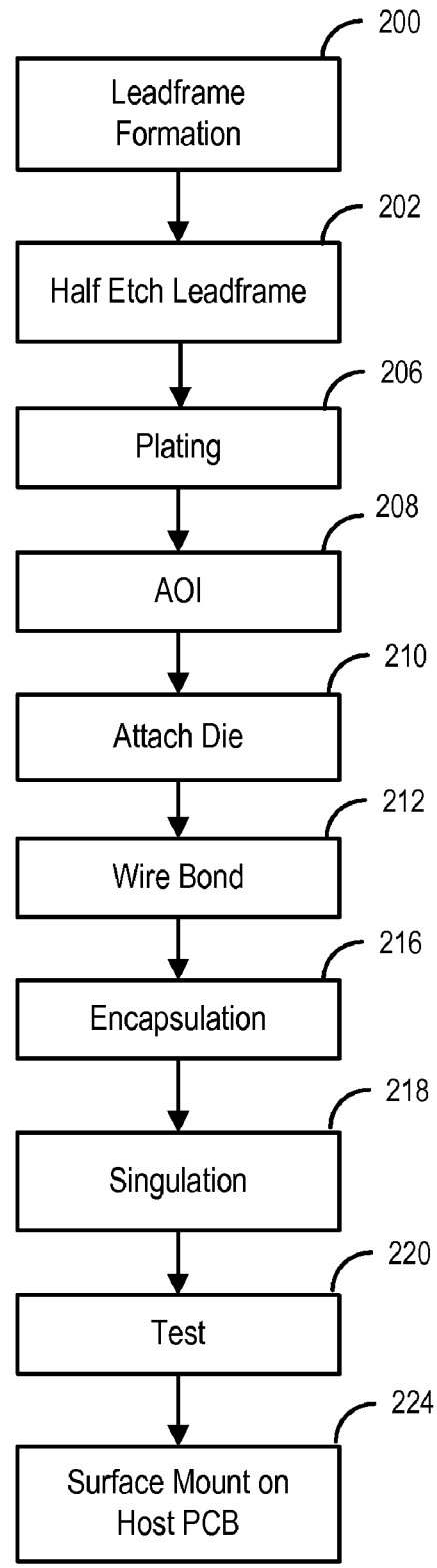
FIG. 4 is a flowchart of a process for fabricating a QFN leadframe package according to embodiments of the present invention.
Figure 5:
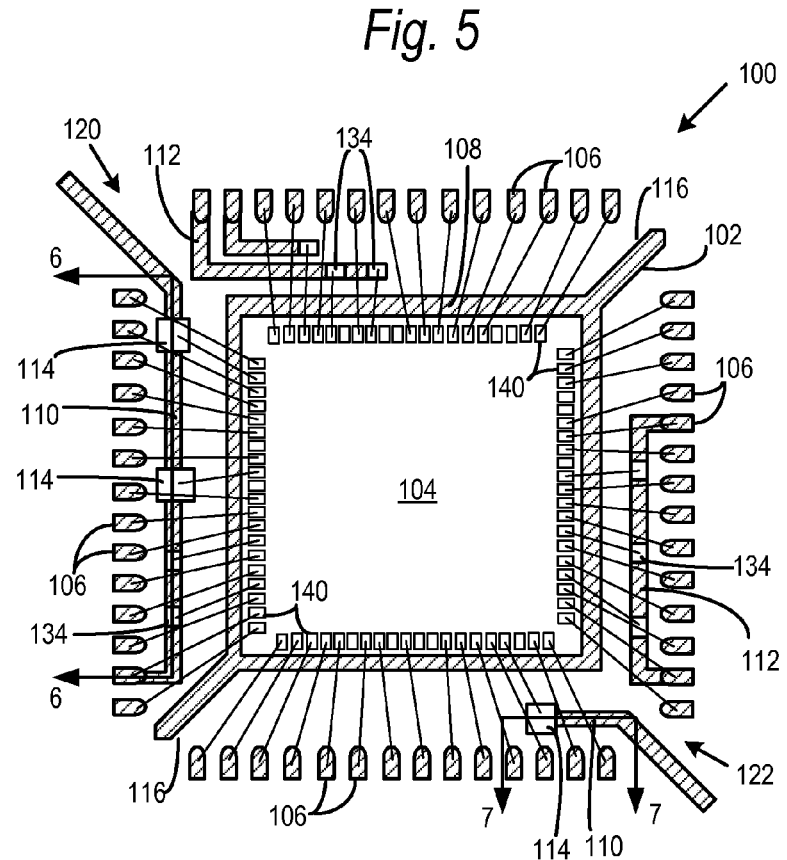
FIG. 5 is a top view of a QFN leadframe according to embodiments of the present invention together with a semiconductor die.

Details relating to the fabrication of a semiconductor leadframe package according to the present invention will be described in detail hereinafter with respect to the flowchart of FIG. 4 and the various views of FIGS. 5-10. A top view of a leadframe package 100 is shown in FIG. 5 prior to encapsulation. The leadframe package 100 of FIG. 5 includes a leadframe 102 and one or more semiconductor die 104. The structure of leadframe 102 is formed in a step 200. Although not shown, the leadframe 102 may be fabricated on a strip of leadframes to achieve economies of scale. Leadframe 102 may be formed of copper, but may be formed of other materials in alternative embodiments.

Formation of the leadframe in step 200 involves the definition of a plurality of electrical terminals 106 and a die paddle 108 on the leadframe 102. The terminals 106 are provided to transfer signals from the semiconductor die 104 to a host PCB (not shown) to which the terminals 106 get soldered. The die paddle 108 is provided for supporting the semiconductor die 104. In accordance with the present invention as explained in greater detail below, step 200 further involves the definition on leadframe 102 of extended leads 110, 112, at least some of which include islands 114. The terminals 106, paddle 108, extended leads 110, 112 and islands 114 may be formed on leadframe 102 by known stamping or photolithographic processes. The stamping or photolithographic processes form spaces in the leadframe 102 to separate and electrically isolate each of the terminals 106 from each other and from die paddle 108.

The step 200 may further include the step of defining a pair of tie bars 116 at diametrically opposed corners of die paddle 108. The tie bars 116 affix the die paddle 108 to the leadframe strip (not shown) prior to an encapsulation step explained hereinafter, as well as serve as a path to ground for the semiconductor die 104 on die paddle 108. As explained in the Background section, prior art leadframes include a tie bar at each corner of the die paddle to support the die paddle.

In accordance with the present invention, the tie bars at diametrically opposed corners may be omitted, so that the die paddle is affixed only by the pair of tie bars 116 at opposed corners of the die paddle. It is understood that the pair of corners including tie bars and the pair of corners not including tie bars may be switched relative to that shown in FIG. 5 in an alternative embodiment. Moreover, in further embodiments, the leadframe 102 may include three tie bars 116 at the corners of die paddle 108, leaving a single corner free of a tie bar.

In the embodiment shown in FIG. 5, tie bars have been omitted from corners 120 and 122. The omission of tie bars from corners 120 and 122 allows the formation of extended leads 110 having a first end affixed to the leadframe strip (not shown). The leads 110 extend from corners 120, 122 and into a space in leadframe 102 between terminals 106 and die paddle 108. A second end of each extended lead 110 may be affixed to a terminal 106 for support, as in lead 110 coming from corner 120. Alternatively, a second end of an extended lead 110 may be free floating, as in lead 110 coming from corner 122.

Extended leads 112 may be formed extending from one or more of the terminals 106 into the space between the terminals 106 and die paddle 108. The leads 112 may have second ends affixed to a second terminal 106 for support, such as lead 112 adjacent corner 122. Alternatively, a second end of leads 112 may be free floating, such as the two leads 112 adjacent corner 120.

A lead 110 and/or 112 may be electrically coupled to the host PCB two ways. First, a lead 110 may include at least one end coupled to a terminal 106, which is in turn surface mounted to the host PCB. Alternatively or additionally, a lead 110 and/or 112 may have an island 114 formed along its length, which island is surface mounted to the host PCB has explained hereinafter. An extended lead 110, 112 may both extend from a terminal 106 and include an island 114 along its length. As explained below, in embodiments, extended leads 110, 112 may be half-etched along their lengths, except for islands 114, so as not to be visible on the bottom of the finished leadframe package 100.

Figure 6:
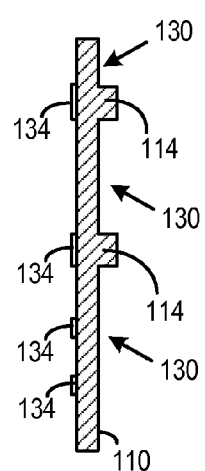
FIG. 6 is a cross-sectional view through line 6-6 of FIG. 5.
Figure 7:
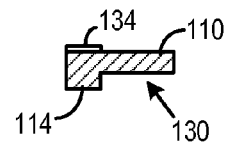
FIG. 7 is a cross-sectional view through line 7-7 of FIG. 5.

Leadframe 102 on the strip starts out having a uniform thickness, which in embodiments may for example be 6 mm to 8 mm. However, in accordance with the present invention, portions of the back surface of leadframe 102 are half-etched in step 202 to reduce the thickness of certain portions of the leadframe. The half-etch step may alternatively be performed after the encapsulation step as described hereinafter. FIG. 6 is a cross-sectional view along line 6-6 through extended lead 110 from corner 120. FIG. 7 is a cross-sectional view along line 7-7 through extended lead 110 from corner 122. As seen, the leads 110 are half-etched on the bottom surface of leadframe 102 in areas 130 to reduce the thickness of leadframe 102 in areas 130. In embodiments, the leads 110, 112 may be half-etched to a thickness of for example between 3 mm and 4 mm. Islands 114 do not get half-etched and remain at the full thickness of the leadframe 102. Thus, the front surface of the leadframe 102 seen in FIG. 5 is planar, and the back surface of the leadframe 102 has sections of different elevations (half-etched areas 130 versus islands 114 and terminals 106).

As explained below, wire bonds are connected at defined positions along the lengths of extended leads 110, 112. Those defined positions may receive plating layer 134, of for example Silver, in step 206 to enhance the electrical connection between the lead 110, 112 and the wire bond as is known in the art.

The number and position of extended leads 110, 112 shown in the Figures is by way of example only. It is understood that alternative embodiments of leadframe 102 may have fewer or greater leads 110, 112, and they may be in configurations other than those shown in the Figures. Similarly, the number and positions of islands 114 and plating layers 134 shown in the Figures is by way of example only. It is understood that alternative embodiments of leadframe 102 may have fewer or greater islands 114 and fewer or greater plating layers 134, and they may be in positions other than those shown in the Figures. Moreover, while islands 114 are shown only on extended leads 110, it is understood that islands 114 may additionally or alternatively be formed on extended leads 112.

After the terminals 106, extended leads 110, 112 and other portions of leadframe 102 have been formed, the leadframe 102 may be inspected in an automatic optical inspection (AOI) in a step 208. Once inspected, one or more semiconductor die 104 may be affixed to leadframe 102 in step 210 and as shown in FIG. 5. Semiconductor die 104 may for example be one or more flash memory chips (NOR/NAND), though other types of memory die are contemplated. Semiconductor die 104 may also be or include a controller die, such as for example an ASIC. Die 104 may be affixed to die paddle 108 in a known die attach process.

In step 212, semiconductor die 104 may be electrically coupled to leadframe 102 using a known wire bonder. Semiconductor die 104 includes die bond pads 140. The bond pads 140 are shown around four sides of the tops surface of the semiconductor die 104. It is understood that bond pads 140 may be provided around less than four sides in alternative embodiments. Some of the wire bonds are connected between bond pads 140 and terminals 106 as shown. Moreover, in accordance with an aspect of the present invention, other wire bonds are connected between bond pads 140 and plating layers 134 on extended leads 110, 112 as shown. As explained in the Background section, given the high density of die bond pads on semiconductor die, it may happen that a particular bond pad 140 needs to be coupled to a particular terminal 106 that is difficult to reach with a wire bond. In such instances, an extended lead 110, 112 may be used as an electrical bridge between the particular bond pad 140 and the particular terminal 106 to which the bond pad must be electrically coupled.

It may also happen that more than one die bond pad 140 need to be connected to a common terminal 106. For example, multiple die bond pads 140 may need to be connected to ground or power signals. As shown by extended lead 112 adjacent to corner 120, multiple die bond pads may be connected to plating layers 134 on the same extended lead 110, 112.

Furthermore, two or more terminals 106 may need to be connected together. As indicated in the Background section, this has conventionally been done by circuitry on the host PCB. In a further aspect of the present invention, an extended lead 112 may be connected to two or more terminals 106, such as for example lead 112 adjacent to corner 122. As is also shown by lead 112 next to corner 122, multiple bond pads 140 may be connected to a single lead 112, which is in turn connected to multiple terminals 106.

After semiconductor die 104 has been mounted on leadframe 102 and all electrical connections have been established, leadframe 102 may be encapsulated in mold compound 144 in step 216 as shown in the cut-away view of FIG. 8, the cross-sectional view of FIG. 9 and the bottom view of FIG. 10. Mold compound 144 may be an epoxy resin such as for example available from Sumitomo Corp. and Nitto Denko Corp., both having headquarters in Japan. Other mold compounds from other manufacturers are contemplated. The mold compound 144 may be applied according to various processes, including by transfer molding or injection molding techniques. The half-etch step 202 was described as taking place prior to attaching the semiconductor die 104 and prior to encapsulation. In alternative embodiments, the half-etch step may be performed after die attach and encapsulation.

The semiconductor die and wire bonds are encapsulated, and, as seen in FIGS. 9 and 10, a portion of leadframe 102 is encapsulated. In particular, the top portion of the leadframe is encapsulated so that portions of the leadframe that were half-etched are completely buried within the mold compound. Thus, the extended leads 110 and 112 are not visible from the bottom side of the encapsulated package. However, the mold compound 144 does not encapsulate those portions of the bottom of the leadframe 102 that were not half-etched. Accordingly, as best seen in the bottom view of FIG. 10, in addition to the terminals 106, the islands 114 formed on leads 110, 112 are visible and exposed on the bottom of the encapsulated package.

The result is that the islands 114 are available in addition to the terminals 106 for surface mounting to the host PCB and for transferring signals between the semiconductor die 104 and the host PCB. For example, in an embodiment including three islands 114, the islands effectively increase the number of terminals available for transferring signals by three. The additional terminals are achieved without any addition to the footprint of the QFN package 100. While embodiments relate to the addition of islands 114 to a QFN package, it is understood that islands may be added to DFN and other leadless packages in alternative embodiments.

As indicated above, the QFN leadframe packages 100 may be fabricated on a strip of leadframes. After the encapsulation step, individual QFN packages 100 may be singulated from the strip in step 218. QFN package 100 may be tested in step 220 to ensure that package 100 is functioning properly. As is known in the art, such testing may include electrical testing, burn in and other tests. The completed QFN package 100 may then be surface mounted to a host PCB in known surface mount and reflow processes. As is known, the terminals and the islands may be plated, for example with tin, to improve the surface bond between the terminals/islands and the host PCB contact pads.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of fabricating a leadframe package including a leadframe and a semiconductor die, the leadframe including a die paddle supporting the semiconductor die and the semiconductor die including die bond pads along at least two sides, the method comprising the steps of:
   (a) defining a plurality of electrical terminals around a periphery of the leadframe, the electrical terminals being exposed at a bottom surface of the leadframe package for connection to a host printed circuit board;
   (b) defining one or more electrically conductive islands on the leadframe at least in part between the electrical terminals and the die paddle and formed at least in part by half-etching an area adjacent the islands on the leadframe, the islands being exposed at the bottom surface of the leadframe package for connection to the host printed circuit board, and one island of the one or more electrically conductive islands connected to at least one other terminal of the plurality of electrical terminals or another island of the one or more electrically conductive islands; and
   (c) wirebonding the die bond pads to the electrical terminals defined in said step (a) and the one or more electrically conductive islands defined in said step (b).

2. The method of claim 1, further comprising the step (d) of defining an electrical lead having a first end oriented at a corner of the leadframe and extending into a space in the leadframe between the electrical terminals and the die paddle, the one or more islands being defined along a length of the electrical lead.

3. The method of claim 2, said step (b) of defining one or more electrically conductive islands on the leadframe comprising the step of forming an electrically conductive island on the electrical lead defined in said step (d) by half-etching the electrical lead defined in said step (d).

4. The method of claim 2, said step (d) of defining an electrical lead comprising the step of coupling a second end of the electrical lead to an electrical terminal of the plurality of electrical terminals.

5. The method of claim 2, said step (d) of defining an electrical lead comprising the step of defining a second end of the electrical lead to be free floating in the space between the electrical terminals and the die paddle.

6. The method of claim 2, further comprising the step (e) of electrically coupling a plurality of die bond pads to the electrical lead.

7. The method of claim 2, said step (b) of defining one or more electrically conductive islands on the leadframe comprising the step of defining a single island along the length of the electrical lead defined in said step (d).

8. The method of claim 2, said step (b) of defining one or more electrically conductive islands on the leadframe comprising the step of defining a plurality of islands along the length of the electrical lead defined in said step (d).

9. The method of claim 1, further comprising the step (f) of defining an electrical lead having a first end coupled to a first electrical terminal of the plurality of terminals and extending into a space in the leadframe between the electrical terminals and the die paddle, the one or more islands being defined along a length of the electrical lead.

10. The method of claim 9, said step (b) of defining one or more electrically conductive islands on the leadframe comprising the step forming the electrically conductive islands by half-etching the electrical lead defined in said step (f).

11. The method of claim 9, said step (f) of defining an electrical lead comprising the step of coupling a second end of the electrical lead to a second electrical terminal of the plurality of electrical terminals.

12. The method of claim 9, said step (f) of defining an electrical lead comprising the step of defining a second end of the electrical lead to be free floating in the space between the electrical terminals and the die paddle.

13. The method of claim 9, further comprising the step (g) of electrically coupling a plurality of die bond pads to the electrical lead.

14. The method of claim 9, said step (b) of defining one or more electrically conductive islands on the leadframe comprising the step of defining a single island along the length of the electrical lead defined in said step (f).

15. The method of claim 9, said step (b) of defining one or more electrically conductive islands on the leadframe comprising the step of defining a plurality of islands along the length of the electrical lead defined in said step (f).

16. The method of claim 1, further comprising the step (g) of encapsulating the one or more semiconductor die and a portion of the leadframe in a mold compound with the electrical terminals and islands having a surface exposed through a surface of the of the mold compound.

17. A method of fabricating a leadframe package including a leadframe and a semiconductor die, the leadframe including a die paddle supporting the semiconductor die and the semiconductor die including die bond pads along at least two sides, the method comprising the steps of:
   (d) defining a plurality of electrical terminals around a periphery of the leadframe, the electrical terminals being exposed at a bottom surface of the leadframe package for connection to a host printed circuit board;
   (e) defining an electrical lead extending into a space between the electrical terminals and the die paddle;
   (f) defining a plurality of electrically conductive islands on the electrical lead at least in part by half-etching an area on the electrical lead, the islands being exposed at the bottom surface of the leadframe package for connection to the host printed circuit board; and
   (g) wirebonding the die bond pads to the electrical terminals defined in said step (a) and the one or more electrically conductive islands defined in said step (c).

18. The method of claim 17, further comprising the step (e) of electrically coupling a plurality of die bond pads to the electrical lead defined in said step (b).

19. The method of claim 17, said step (b) of defining electrical lead comprising the step of having a first end of the electrical lead extending into the leadframe from a first corner of the leadframe.

20. The method of claim 19, further comprising the step of having a first end of a second electrical lead extending into the leadframe from a second corner of the leadframe diametrically opposed to the first corner.

21. The method of claim 20, further comprising the step of having a first end of a third electrical lead extending into the leadframe from a third corner of the leadframe between the first and second corners.

22. The method of claim 19, said step (b) of defining electrical lead comprising the step of defining a second end of the electrical lead to be free floating in the space between the electrical terminals and the die paddle.

23. The method of claim 17, said step (b) of defining electrical lead comprising the step of having a first end of a first electrical lead coupled to a first electrical terminal of the plurality of electrical terminals.

24. The method of claim 23, said step (b) of defining electrical lead comprising the step of coupling a second end of the first electrical lead to a second electrical terminal of the plurality of electrical terminals.

25. The method of claim 23, said step (b) of defining electrical lead comprising the step of defining a second end of the electrical lead to be free floating in the space between the electrical terminals and the die paddle.

26. A method of fabricating a leadframe package including a leadframe and a semiconductor die, the leadframe including a die paddle supporting the semiconductor die, the die paddle having a pair of tie bars at first and third diametrically opposed corners for supporting the die paddle in the leadframe, and the semiconductor die including die bond pads along at least two sides, the method comprising the steps of:
- (h) defining a plurality of electrical terminals around a periphery of the leadframe, the electrical terminals being exposed at a bottom surface of the leadframe package for connection to a host printed circuit board;
- (i) defining a first electrical lead coupled to a first electrical terminal of the plurality of electrical terminals, the first electrical lead extending into a space between the electrical terminals and the die paddle;
- (j) defining a first electrically conductive island along the first electrical lead at least in part by half-etching the first electrical lead, the first island being exposed at the bottom surface of the leadframe package for connection to the host printed circuit board;
- (k) defining a second electrical lead extending from one of the second and fourth corners of the leadframe, the second electrical lead extending into a space between the electrical terminals and the die paddle; and
- (e) defining a second electrically conductive island along the second electrical lead at least in part by half-etching the second electrical lead, the second island being exposed at the bottom surface of the leadframe package for connection to the host printed circuit board;
- (f) wirebonding the die bond pads to the electrical terminals defined in said step (a) and the first and second electrically conductive islands defined in said steps (c) and (e).

27. A method of claim 26, further comprising the step (g) of defining a second electrically conductive island along one of the first and second electrical leads at least in part by half-etching the first or second electrical lead, the second island being exposed at the bottom surface of the leadframe package for connection to the host printed circuit board.

28. The method of claim 26, further comprising the step (h) of encapsulating the one or more semiconductor die and a portion of the leadframe in a mold compound with the electrical terminals and islands having a surface exposed through a surface of the of the mold compound.

* * * * *